(12) United States Patent
Al-Dabagh et al.

(10) Patent No.: US 6,747,349 B1
(45) Date of Patent: Jun. 8, 2004

(54) TERMINATION RING FOR INTEGRATED CIRCUIT

(75) Inventors: Maad Al-Dabagh, San Jose, CA (US); Thomas Antisseril, Newark, CA (US); Bo Shen, Fremont, CA (US); Prasad Subbarao, San Jose, CA (US); Radoslav Ratchkov, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/335,649

(22) Filed: Dec. 31, 2002

(51) Int. Cl.$^7$ ................................................. H01L 23/52
(52) U.S. Cl. ........................ 257/691; 257/692; 257/700
(58) Field of Search .............................. 257/691, 692, 257/700; 365/63

(56) References Cited

U.S. PATENT DOCUMENTS

| | | | |
|---|---|---|---|
| 5,311,058 A | | 5/1994 | Smolley |
| 5,723,899 A | * | 3/1998 | Shin .......................... 257/666 |
| 5,723,908 A | | 3/1998 | Fuchida et al. |
| 5,886,917 A | * | 3/1999 | Yasukawa et al. |
| 6,111,310 A | | 8/2000 | Schultz |
| 6,194,768 B1 | | 2/2001 | Gardner et al. |
| 6,346,721 B1 | | 2/2002 | Schultz |
| 6,476,497 B1 | | 11/2002 | Waldron et al. |
| 6,545,348 B1 | * | 4/2003 | Takano ....................... 257/691 |

* cited by examiner

*Primary Examiner*—Roy Potter
(74) *Attorney, Agent, or Firm*—The Law Offices of William W. Cochran, LLC

(57) ABSTRACT

A rectangular termination ring for a power distribution mesh is placed on the upper two layers of an integrated circuit and may be placed over some I/O circuitry. The strapping connecting the bonding pads to the termination ring are placed on upper levels of the integrated circuit, minimizing the via requirements and freeing space for additional circuitry. Further, the termination ring may be adapted to work in conjunction with L-shaped, as well as other power distribution meshes.

26 Claims, 4 Drawing Sheets

TERMINATION RING FOR INTEGRATED CIRCUIT

BACKGROUND OF THE INVENTION a. Field of the Invention

The present invention pertains to wiring within integrated circuits and specifically to power distribution circuits within integrated circuits.

b. Description of the Background

An integrated circuit (IC) typically includes two or more layers dedicated to power distribution. The power distribution layers may have various arrangements for grossly transmitting current throughout the IC to the various cells that require power.

Various power distribution meshes are known in the art. Examples are U.S. Pat. No. 6,346,721 entitled "Integrated Circuit Having Radially Varying Power Bus Grid Architecture" by Schultz, U.S. Pat. No. 6,111,310 entitled "Radially Increasing Core Power Bus Grid Architecture" by Schultz, copending and commonly assigned U.S. patent application Ser. No. 09/948,190 entitled "Power Redistribution Bus for a Wire Bonded Integrated Circuit" by Schultz, et al., filed Sep. 7, 2001, copending and commonly assigned U.S. patent application Ser. No. 09/968,286 entitled "Die Power Distribution Bus" by Ali, et al, filed Oct. 1, 2001, all of which are hereby specifically incorporated herein by reference for all they disclose and teach.

In general, these distribution meshes address the transmittal of current to the inside portions of a die. However, there is need in the art for an improved termination ring that provides the distributed current to the periphery of the mesh.

One type of IC is known as an Application Specific Integrated Circuit (ASIC). The design of ASICs comprises many pre-designed circuits that are connected to create the necessary logic and circuitry for the specific task. One type of pre-designed circuit is an I/O circuit. The I/O circuit is the circuitry that is close to the bonding pad. Recent designs have increased the size of the I/O circuits, known as 'tall I/O', referring to the length of the rectangular shape of the I/O circuits.

In older ASIC designs, it had been commonplace to place a termination ring for a power distribution mesh inside of the I/O circuits for a number of reasons. However, as the size of some of the I/O circuits has grown, it has become impractical to adhere to this design rule. As such, rectilinear termination rings have been designed to avoid the tall I/O circuits by changing shape to meander around the tall I/O. These types of termination rings may occupy more space on the die than necessary and thus may cause the die to be larger to accommodate the larger termination ring. Further, as the I/O circuits become taller, the termination ring is placed further inward, causing a longer distance for the power to travel from a bonding pad to the termination ring. The increased distance causes the trace or strap from the bonding pad to the termination ring to become wider and may increase the number of bonding pads required for transmitting sufficient current to the termination ring. In some cases, the number of bonding pads required for the specific application may determine the size of the die. In such cases, increases in the number of bonding pads may increase the die size, adding to the cost of the resultant IC.

The design convention has been that I/O circuits have been placed in lower metal layers of the IC. Further, the traces from the bonding pads to the termination ring have been commonly incorporated into special I/O circuits known as power I/O. The traces or straps that transfer the current from the outside of the die to the termination ring within the die require vias to transfer the current between layers. The size and depth of the vias necessarily take up space within the die that is otherwise useable.

It would therefore be advantageous to provide a system and method for a power termination ring in an integrated circuit that requires a minimum of space on the periphery of the die. It would further be advantageous to provide a termination ring that accommodated tall I/O circuits as well as occupied a minimum amount of space within and integrated circuit so that additional circuitry may be placed in an IC without increasing the size of the IC.

SUMMARY OF THE INVENTION

The present invention overcomes the disadvantages and limitations of the prior art by providing a system and method for placing a termination ring and straps in the top two layers of an integrated circuit. The termination ring may be placed over I/O circuits so that the distance between a bonding pad and the termination ring is minimized. Further, the termination ring architecture is adapted to L-shaped power distribution meshes as well as other power distribution meshes.

The present invention may therefore comprise a power distribution system for an integrated circuit die comprising: a first electrically conductive ring about the periphery of the die wherein the first ring is located above at least one I/O circuit; a second electrically conductive ring substantially inwardly offset from the first ring and positioned on the layer below the layer of the first ring; a first connection from the first ring to a first bonding pad wherein at least a continuous electrical connection is located in the same layer as the first ring; and a second connection from the second ring to a second bonding pad wherein at least a continuous electrical connection is located in the same layer as the second ring.

The present invention may further comprise an integrated circuit with a power distribution system comprising: a first electrically conductive ring about the periphery of the die of the integrated circuit wherein the first ring is located above at least one I/O circuit; a second electrically conductive ring substantially inwardly offset from the first ring and positioned on the layer below the layer of the first ring; a first connection from the first ring to a first bonding pad wherein at least a continuous electrical connection is located in the same layer as the first ring; and a second connection from the second ring to a second bonding pad wherein at least a continuous electrical connection is located in the same layer as the second ring.

The present invention may further comprise an integrated circuit with a power distribution system comprising: a first electrically conductive power distribution means about the periphery of the die of the integrated circuit wherein the first electrically conductive power distribution means is located above at least one I/O circuit; a second electrically conductive power distribution means substantially inwardly offset from the first electrically conductive power distribution means and positioned on the layer below the layer of the first electrically conductive power distribution means; a first connection means from the first electrically conductive power distribution means to a first off-die connection means wherein at least a continuous electrical connection is maintained in the same layer as the first electrically conductive power distribution means; and a second connection means from the second electrically conductive power distribution means to a second off-die connection means wherein at least a continuous electrical connection is maintained in the same layer as the second electrically conductive power distribution means.

The advantages of the present invention are that a minimum of space within an integrated circuit is used to transfer current from the bonding pads to a power distribution mesh. Certain critical spaces, such as the area around the periphery of the integrated circuit die and the area from the bonding pads to the termination ring are minimized so that the size of the die may be minimized and additional circuitry may be placed in the integrated circuit.

DETAILED DESCRIPTION OF THE INVENTION

Figure 1:
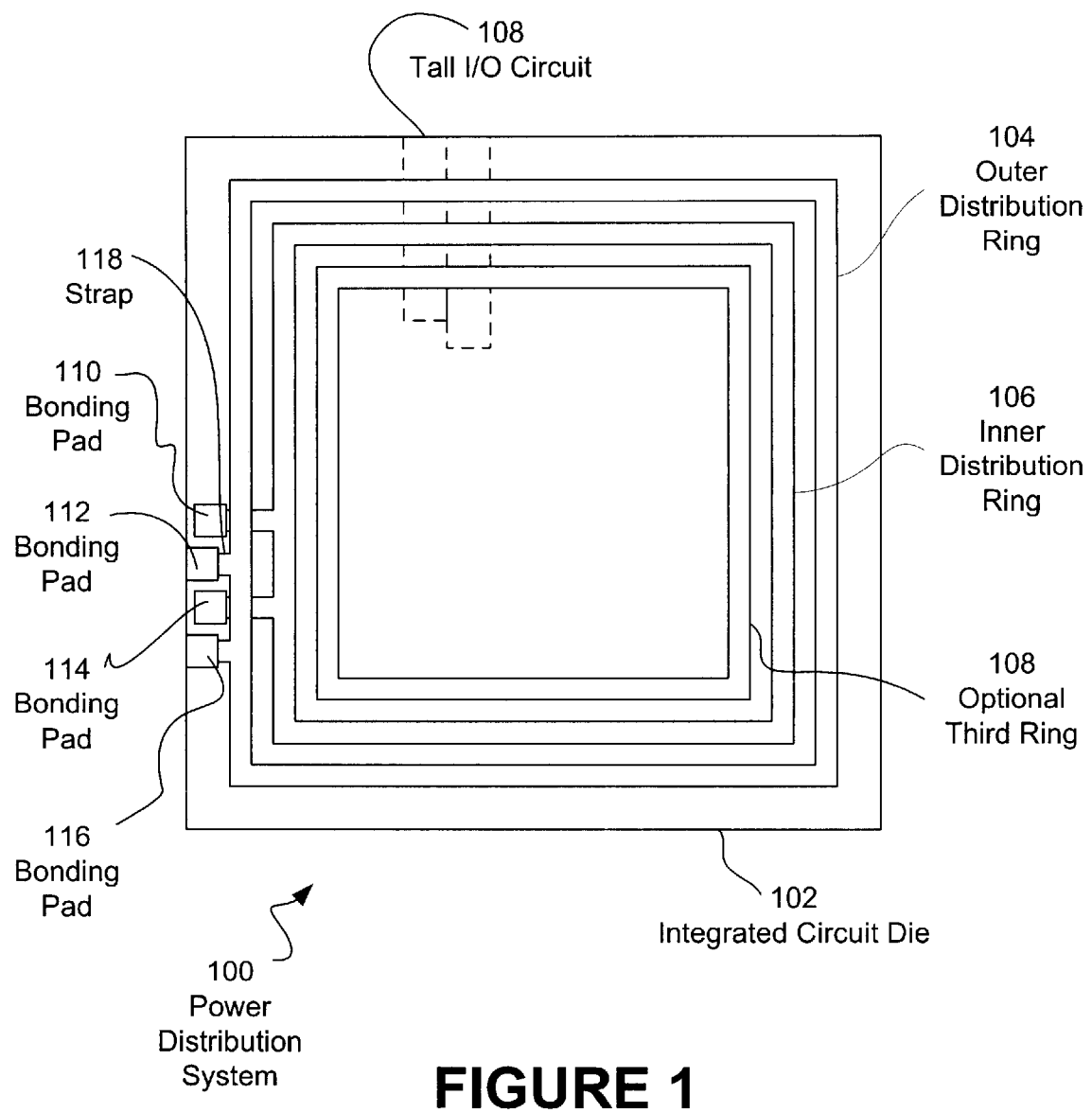
FIG. 1 is an illustration of an embodiment of the present invention wherein an integrated circuit die has an outer distribution ring, and inner distribution ring, and an optional third distribution ring.

FIG. 1 illustrates an embodiment 100 of the present invention wherein an integrated circuit die 102 has an outer distribution ring 104, and inner distribution ring 106, and an optional third distribution ring 107. The three rings 104, 106, and 107 are positioned over several tall I/O circuits 108. The bonding pads 110 connect to the rings 104 and 107 through the strap 118.

The embodiment 100 takes the current provided on the bonding pads 110, 112, 114, and 116 and distributes the current around the periphery of the die 102. The use of a peripheral ring to distribute current allows various meshes known in the art to transfer current throughout the die.

In the present embodiment, the outer ring 104 may be placed on the top layer of the die, where the metal traces may be thicker than on other layers. The inner rings 106 and 107 may be placed on the next layer below that of the outer ring 104. In other embodiments, the outer ring 104 may be on another layer other than the topmost layer. In still other embodiments, the inner rings 106 and 107 may be on the layer above the outer layer 104.

Some mesh designs have a primary layer. For example, an L-shaped mesh has a single layer in which most of the power distribution traces reside. Such a layer would be the primary layer of the mesh. Other mesh designs may require two or more planes, and may not have a singular primary plane. In embodiments with a single primary layer, the primary layer of the mesh will generally be on the same layer as the outermost ring.

The straps 118 may be on the same layers as the respective rings to which they are attached. Other traces may exist below or above the layers on which the straps exist. However, the primary current path may be within the layer of the respective distribution ring. For example, the straps associated with bonding pads 110 and 114 may be in the same layer as the outer ring 104.

In some embodiments, the straps may comprise traces on a plurality of layers. For example, a strap 118 may comprise a trace on the top layer and a substantially identical trace on the layer below. A series of vias may be present to connect the top trace with the bottom trace, effectively making a thicker connection to handle increased currents with less resistance.

The embodiment 100 shows two bonding pads associated with each distribution ring. In different embodiments, those skilled in the art will appreciate that more or less bonding pads and straps may be required depending on the amount of current to be supplied to the mesh.

The outer ring 104 is shown placed above the tall I/O circuits 108. The placement of the rings 104, 106, and 107 over the I/O circuits 108 means that the rings 104, 106, and 107 may be further toward the edges of the die 102. By moving the current distribution rings 104, 106, and 107 outward, the distance between the bonding pad 110 and the ring 104 is minimized. This means that the width and thickness of the straps may be lessened because the straps induce less resistance when they are shorter in length. In some designs, moving the rings outward may eliminate the need for one or more straps, freeing up some space for an additional I/O circuit or causing the integrated circuit to be designed on a smaller die.

The third ring 107 is an optional ring. In some embodiments, the third ring 107 may not be present, and the outer ring 104 may be sufficient to carry the current load.

Figure 2:
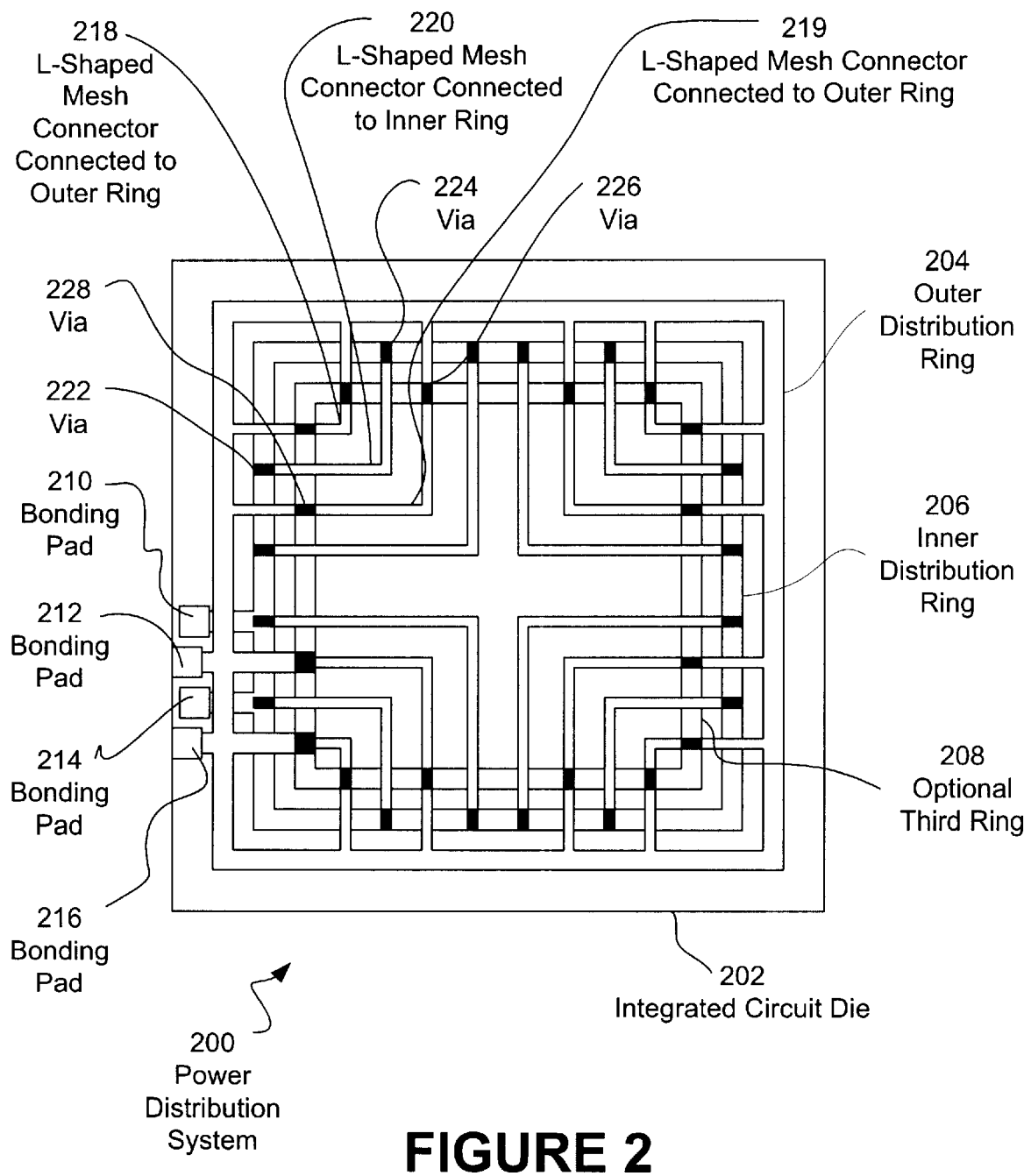
FIG. 2 is an illustration of an embodiment of the present invention wherein an L-shaped mesh is incorporated with the distribution rings.

FIG. 2 illustrates an embodiment 200 of the present invention wherein an L-shaped mesh is shown. The integrated circuit die 202 has an outer distribution ring 204, an inner distribution ring 206, and an optional third ring 208. As with embodiment 100, bonding pads 210, 212, 214, and 216 are connected to the various rings. The traces 218 and 219 represent traces connected to the outer distribution ring 204. The trace 220 is likewise connected to the inner ring 206. The layer for the mesh traces 218 and 220 may be the same layer as the outermost ring 204. The trace 220 may be connected to the inner ring 206 with vias 220 and 224.

In the embodiment 200, the primary layer of the mesh is the layer in which the traces 218 and 220 reside. The primary layer is also the layer in which the outer ring 204 resides.

The interior of the third ring 208 is free for other trace routing. In some embodiments, the area within the third ring 208 may be necessary for the normal connections amongst the circuitry of the integrated circuit. As the power distribution design frees up more area, more functionality may be incorporated into the integrated circuit while maintaining the same die size.

Figure 3:
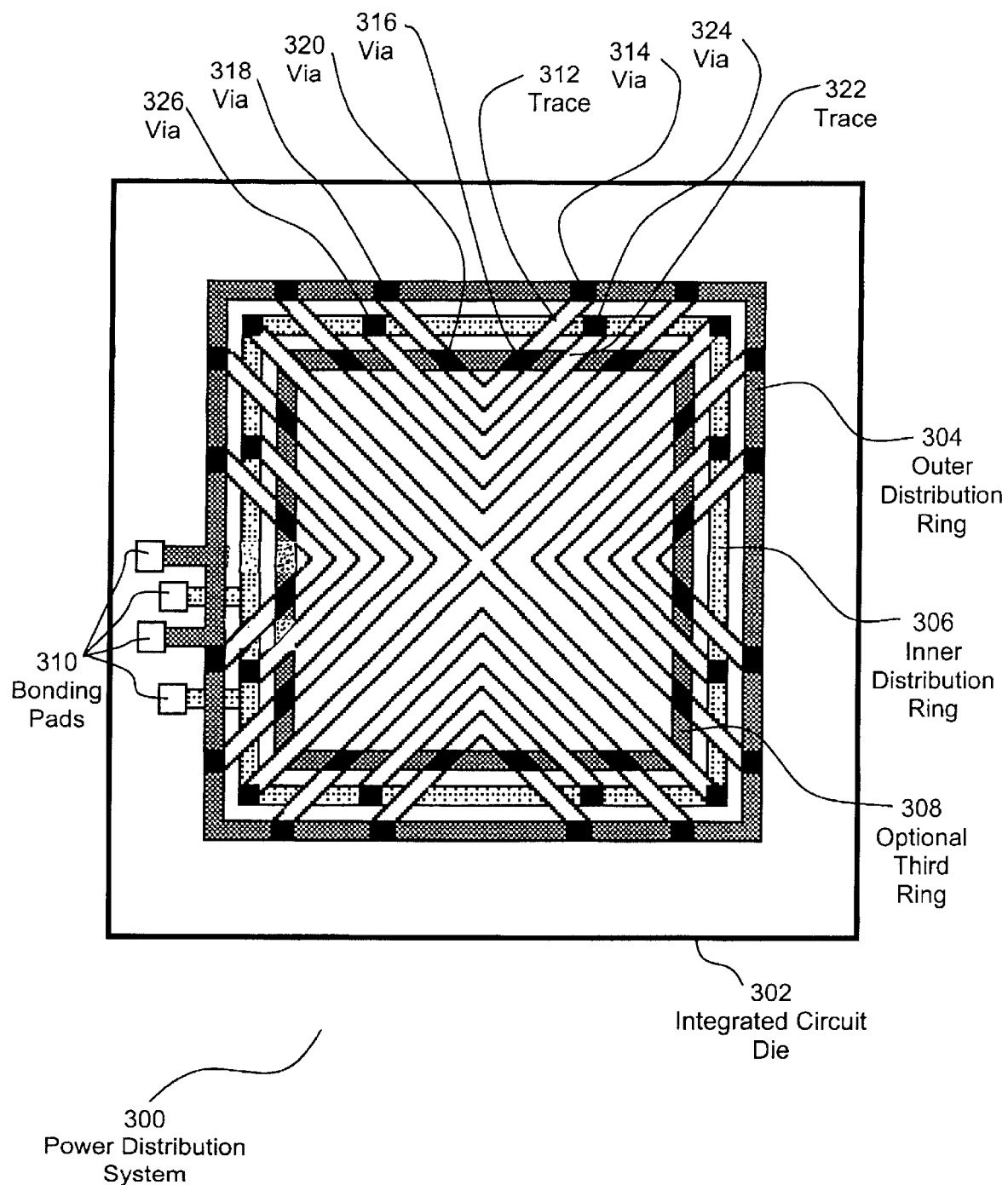
FIG. 3 is an illustration of an embodiment of the present invention wherein an V-shaped mesh is incorporated with the distribution rings.

FIG. 3 illustrates an embodiment 300 of a power distribution system utilizing a V-shaped mesh. The integrated circuit die 302 contains an outer ring 304, an inner ring 306, and an optional third ring 308 in a similar fashion to embodiments 100 and 200 discussed above. The bonding pads 310 are similar to those of embodiments 100 and 200.

The trace 312 is connected to the outer ring 304 and the third ring 308 by vias 314, 316, 318, and 320. Trace 322 is connected to the inner ring 306 by vias 324 and 326. The other traces shown are alternatively connected to the inner ring 304 and the outer ring 306 to distribute power throughout the chip.

Embodiment 300 illustrates how different mesh designs may be used with multiple distribution rings. Those skilled in the art may envision many different mesh designs that may be similarly incorporated into the present multiple ring design.

Figure 4:
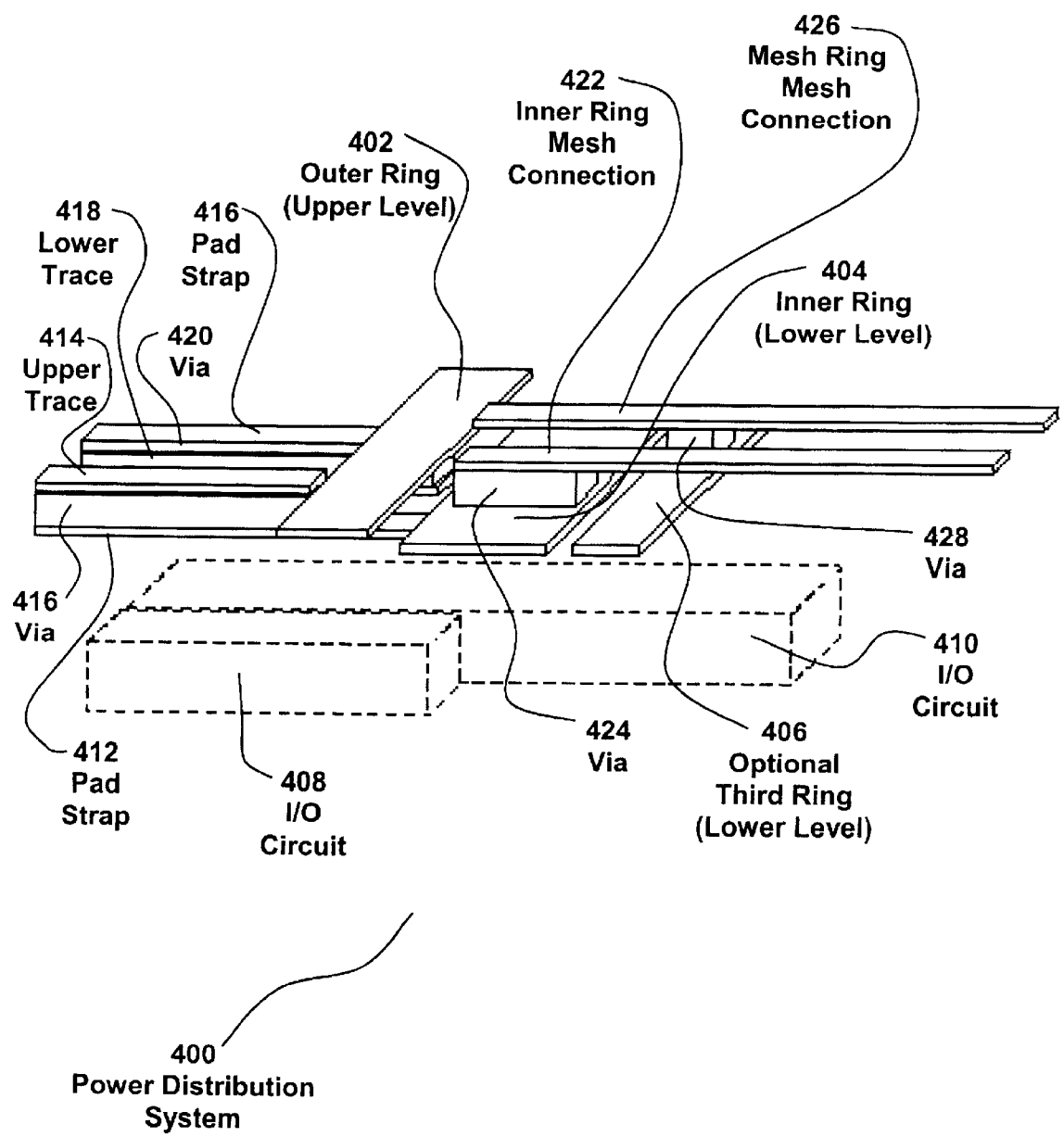
FIG. 4 is a three dimensional representation of an embodiment of a power distribution system.

FIG. 4 illustrates a three dimensional representation of an embodiment 400 of a power distribution system. The outer ring 402 is located on an upper level whereas the inner ring 404 and optional third ring 406 are located on a lower level, typically the next layer below that of the outer ring 402. The rings 402, 404, and 406 are located over I/O circuitry that is represented by boxes 408 and 410.

The pad strap 412 connects a bonding pad (not shown) to the inner ring 404. The pad strap 412 may comprise an upper trace 414 with vias 416 to form a sandwich capable of carrying more current than one trace 412 alone. Pad strap 416 connects from a bonding pad (not shown) to the inner trace 402 and is similarly constructed. The strap 416 comprises a lower trace 418 and vias 420 to form a sandwich.

The mesh connection 422 is connected to the inner ring 404 through via 424. The mesh connection 426 is connected to the outer ring 402 and the inner ring 408 through via 428.

The present illustration is schematic in nature, but was chosen to best illustrate the connections of the various elements. In practice, the physical shape and proximity of the components may be substantially different while maintaining within the spirit and intent of the present invention.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A power distribution system for an integrated circuit die comprising:
   a first electrically conductive ring about the periphery of said die wherein said first ring is located above at least one I/O circuit;
   a second electrically conductive ring substantially inwardly offset from said first ring and positioned on the layer below the layer of said first ring;
   a first connection from said first ring to a first bonding pad wherein at least a continuous electrical connection is located in the same layer as said first ring; and
   a second connection from said second ring to a second bonding pad wherein at least a continuous electrical connection is located in the same layer as said second ring.

2. The power distribution system of claim 1 wherein said first ring is placed on the topmost layer of said die.

3. The power distribution system of claim 1 wherein said first ring is substantially concentric with the edges of said die.

4. The power distribution system of claim 1 wherein said power distribution system is adapted to connect to an L-shaped power distribution mesh.

5. The power distribution system of claim 1 wherein said power distribution system is adapted to connect to a radially varying power distribution mesh.

6. The power distribution system of claim 1 wherein a plurality of first bonding pads are connected to said first ring by a plurality of said first connections.

7. The power distribution system of claim 1 wherein a plurality of second bonding pads are connected to said second ring by a plurality of said second connections.

8. The power distribution system of claim 1 further comprising:
   a third ring substantially inwardly offset from said second ring and positioned on said layer below said layer of said first ring; and
   at least one connection from said first ring to said third ring.

9. An integrated circuit with a power distribution system comprising:
   a first electrically conductive ring about the periphery of the die of said integrated circuit wherein said first ring is located above at least one I/O circuit;
   a second electrically conductive ring substantially inwardly offset from said first ring and positioned on the layer below the layer of said first ring;
   a first connection from said first ring to a first bonding pad wherein at least a continuous electrical connection is located in the same layer as said first ring; and
   a second connection from said second ring to a second bonding pad wherein at least a continuous electrical connection is located in the same layer as said second ring.

10. The power distribution system of said integrated circuit of claim 9 wherein said first ring is placed on the topmost layer of said die.

11. The power distribution system of said integrated circuit of claim 9 wherein said first ring is substantially concentric with the edges of said die.

12. The power distribution system of said integrated circuit of claim 9 wherein said power distribution system is adapted to connect to an L-shaped power distribution mesh.

13. The power distribution system of said integrated circuit of claim 9 wherein said power distribution system is adapted to connect to a radially varying power distribution mesh.

14. The power distribution system of said integrated circuit of claim 9 wherein a plurality of first bonding pads are connected to said first ring by a plurality of said first connections.

15. The power distribution system of said integrated circuit of claim 9 wherein a plurality of second bonding pads are connected to said second ring by a plurality of said second connections.

16. The power distribution system of said integrated circuit of claim 9 further comprising:
   a third ring substantially inwardly offset from said second ring and positioned on said layer below said layer of said first ring; and
   at least one connection from said first ring to said third ring.

17. An integrated circuit with a power distribution system comprising:
   a first electrically conductive power distribution means about the periphery of the die of said integrated circuit wherein said first electrically conductive power distribution means is located above at least one I/O circuit;
   a second electrically conductive power distribution means substantially inwardly offset from said first electrically conductive power distribution means and positioned on the layer below the layer of said first electrically conductive power distribution means;
   a first connection means from said first electrically conductive power distribution means to a first off-die connection means wherein at least a continuous electrical connection is maintained in the same layer as said first electrically conductive power distribution means; and a second connection means from said second electrically conductive power distribution means to a second off-die connection means wherein at least a continuous electrical connection is maintained in the same layer as said second electrically conductive power distribution means.

18. The power distribution system of said integrated circuit of claim 17 wherein said first off-die connection means comprises a bonding pad.

19. The power distribution system of said integrated circuit of claim 17 wherein said second off-die connection means comprises a bonding pad.

20. The power distribution system of said integrated circuit of claim 17 wherein said first electrically conductive power distribution means is placed on the topmost layer of said die.

21. The power distribution system of said integrated circuit of claim 17 wherein said first electrically conductive power distribution means is substantially concentric with the edges of said die.

22. The power distribution system of said integrated circuit of claim 17 wherein said power distribution system is adapted to connect to an L-shaped power distribution mesh.

23. The power distribution system of said integrated circuit of claim 17 wherein said power distribution system is adapted to connect to a radially varying power distribution system.

24. The power distribution system of said integrated circuit of claim 18 wherein a plurality of first bonding pads are connected to said first ring by a plurality of said first connections.

25. The power distribution system of said integrated circuit of claim 19 wherein a plurality of second bonding pads are connected to said second ring by a plurality of said second connections.

26. The power distribution system of said integrated circuit of claim 17 further comprising:

a third electrically conductive power distribution means substantially inwardly offset from said second electrically conductive power distribution means and positioned on said layer below said layer of said first power electrically conductive distribution means; and at least one electrically conductive connection from said first electrically conductive power distribution means to said third electrically conductive power distribution means.

* * * * *